US007355673B2

(12) United States Patent
Hsu et al.

(10) Patent No.: US 7,355,673 B2
(45) Date of Patent: Apr. 8, 2008

(54) METHOD, PROGRAM PRODUCT AND APPARATUS OF SIMULTANEOUS OPTIMIZATION FOR NA-SIGMA EXPOSURE SETTINGS AND SCATTERING BARS OPC USING A DEVICE LAYOUT

(75) Inventors: Duan-Fu Stephen Hsu, Fremont, CA (US); Armin Liebchen, Hayward, CA (US)

(73) Assignee: ASML Masktools B.V., Veldhoven (NL)

( * ) Notice: Subject to any disclaimer, the term of this patent is extended or adjusted under 35 U.S.C. 154(b) by 535 days.

(21) Appl. No.: 10/878,489

(22) Filed: Jun. 29, 2004

(65) Prior Publication Data

US 2005/0028129 A1    Feb. 3, 2005

Related U.S. Application Data

(60) Provisional application No. 60/483,102, filed on Jun. 30, 2003.

(51) Int. Cl.
G03B 27/42 (2006.01)
G03B 27/54 (2006.01)
G03B 27/32 (2006.01)
G03C 5/00 (2006.01)

(52) U.S. Cl. .................. 355/53; 355/67; 355/77; 430/30

(58) Field of Classification Search .................. 355/53, 355/55, 67, 77; 716/19, 21; 430/5, 30
See application file for complete search history.

(56) References Cited

U.S. PATENT DOCUMENTS

| 5,229,255 A | 7/1993 | White |
| 5,229,872 A | 7/1993 | Mumola |
| 5,242,770 A | 9/1993 | Chen et al. |
| 5,256,505 A | 10/1993 | Chen et al. |
| 5,288,569 A | 2/1994 | Lin |

(Continued)

FOREIGN PATENT DOCUMENTS

EP    0 770 926 A2    5/1997

(Continued)

OTHER PUBLICATIONS

"Electromagnetic diffraction in optical systems 1. An integral representation of the image field", E. Wolf, (1959).
"Fobidden Pitches for 130nm lithography and below", Robert Socha et al., Optical Microlithography X111, Proceedings of SPIE, vol. 4000 (2000).
"Theory of high-NA imaging in homogeneous thin films", Doris G. Flagello et al., vol. 13, No. 1 (Jan. 1996), J. Opt. Soc. Am. A.
"Extension of the Hopkins theory of partially coherent imaging to include thin-film interference effects", Michael S. Yeung et al., SPIE vol. 1927, Optical/Laser Microlighography V1 (1993).

(Continued)

*Primary Examiner*—Alan Mathews
(74) *Attorney, Agent, or Firm*—McDermott Will & Emery LLP

(57) ABSTRACT

Disclose is a method, program product and apparatus for optimizing numerical aperture ("NA") and sigma of a lithographic system based on the target layout. A pitch or interval analysis is performed to identify the distribution of critical pitch over the design. Based on the pitch or interval analysis, a critical dense pitch is identified. NA, sigma-in, sigma-out parameters are optimized such that the critical feature will print with or without bias adjustment. For features other than the critical dense features, adjustments are made in accordance with OPC, and lithographic apparatus settings are further mutually optimized. Accordingly, lithographic apparatus settings may be optimized for any pattern concurrently with OPC.

11 Claims, 8 Drawing Sheets

U.S. PATENT DOCUMENTS

| | | | |
|---|---|---|---|
| 5,296,891 A | 3/1994 | Vogt et al. | |
| 5,324,600 A | 6/1994 | Jinbo et al. | |
| 5,362,584 A | 11/1994 | Brock et al. | |
| 5,424,154 A | 6/1995 | Borodovsky | |
| 5,436,095 A | 7/1995 | Mizuno et al. | |
| 5,447,810 A | 9/1995 | Chen et al. | |
| 5,523,193 A | 6/1996 | Nelson | |
| 5,538,815 A | 7/1996 | Oi et al. | |
| 5,585,210 A | 12/1996 | Lee et al. | |
| 5,663,893 A | 9/1997 | Wampler et al. | |
| 5,707,765 A | 1/1998 | Chen | |
| 5,723,233 A | 3/1998 | Garza et al. | |
| 5,821,014 A | 10/1998 | Chen et al. | |
| 5,827,623 A | 10/1998 | Ishida et al. | |
| 5,969,441 A | 10/1999 | Loopstra et al. | |
| 6,046,792 A | 4/2000 | Van Der Werf et al. | |
| 6,114,071 A | 9/2000 | Chen et al. | |
| 6,553,562 B2 * | 4/2003 | Capodieci et al. | 716/19 |
| 2002/0157081 A1 * | 10/2002 | Shi et al. | 716/19 |
| 2003/0198872 A1 * | 10/2003 | Yamazoe et al. | 430/5 |

FOREIGN PATENT DOCUMENTS

| | | |
|---|---|---|
| EP | 1 237 046 A2 | 9/2002 |
| EP | 1 239 331 A2 | 9/2002 |
| EP | 1 308 780 A2 | 5/2003 |
| EP | 1 357 426 A2 | 10/2003 |
| JP | 6005487 | 1/1994 |
| JP | 6120114 | 4/1994 |
| JP | 6163350 | 6/1994 |
| JP | 6181166 | 6/1994 |
| JP | 6301192 | 10/1994 |
| JP | 7134390 | 5/1995 |
| WO | WO 98/40791 | 9/1998 |

OTHER PUBLICATIONS

"An OPC Technology Roadmap to 0.14 μm Design Rules", J. Fung Chen et al., SPIE vol. 3236, date unknown.

"Fabrication of Dense Contact Patterns Using Halftone Phase-Shifting Mask With Off-Axis Illumination", Hyoung-Joon Kim et al., SPIE vol. 2793, date unknown.

"Reduce or Eliminate Line-End Shortening and Iso/Dense Bias by Tuning NA, Sigma", Olivier Toublan et al., Proc. SPIE, vol. 3334, pp. 912-920, 1998.

"Lithocruiser", MaskTools' Products, Retrieved from the Internet:<URL:www.masktools.com/content/lighocruiser.htm>m retrieved on Mar. 2, 2006. Whole document.

"Extending Aggressive Low $k_1$ Design Rule Requirements for 90nm and 65nm Nodes via Simultaneous Optimization of NA, Illumination, and OPC", Proc. SPIE, vol. 5379, pp. 190-201, 2004. Whole document.

* cited by examiner

METHOD, PROGRAM PRODUCT AND APPARATUS OF SIMULTANEOUS OPTIMIZATION FOR NA-SIGMA EXPOSURE SETTINGS AND SCATTERING BARS OPC USING A DEVICE LAYOUT

CLAIM OF PRIORITY

This patent application, and any patent(s) issuing therefrom, claim priority from U.S. provisional patent application No. 60/483,102, filed on Jun. 30, 2003, entitled "A method and program product of simultaneous optimization for NA-Sigma exposure settings and scattering bars OPC using a device layout," which is incorporated herein by reference in its entirety.

TECHNICAL FIELD

The technical field relates generally to a method, program product, and apparatus for microlithography for optimizing lithographic apparatus settings, and optimizing optical proximity correction (OPC).

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). However, as the size of lithographically fabricated structures decrease, and the density of the structures increases, the cost and complexity of designing masks additionally increases. That is, as the demand continues for higher performance of semiconductor devices, the design rule shrink rate is outpacing the progress of both of the exposure wavelength reduction and the advancement of high Numerical Aperture (NA) lenses. Therefore, resolution enhancement techniques have been indispensable in low k1 systems. Types of enhancement techniques include optical proximity correction (OPC) and the optimization of the lithographic apparatus, especially the optimization of the NA and partial coherence factor (sigma). These techniques help to overcome certain proximity effects; however, they are manually performed.

Moreover, OPC techniques include feature biasing and strategic placement of sub-lithographic features on the original mask pattern to compensate for proximity effects, thereby improving the final transferred circuit pattern. Sub-resolution assist features, or scattering bars, have been used as a means to correct for optical proximity effects and have been shown to be effective for increasing the overall process window (i.e., the ability to consistently print features having a specified CD regardless of whether or not the features are isolated or densely packed relative to adjacent features). The scattering bars function to change the effective pattern density (of the isolated or less dense features) to be more dense, thereby negating the undesirable proximity effects associated with printing of isolated or less dense features.

For the intermediate pitch features pitches, where there is no room to insert a SB, a typical method of optical proximity correction (OPC) is to adjust the feature edges (or apply bias) so that the printed feature width is closer to the intended width. In order for the use of the sub-resolution features and/or feature biasing to be effective for minimizing optical proximity effects, an operator having a substantial amount of knowledge regarding mask design and the printing process, as well as a substantial amount of experience, is required to modify the mask design to include the sub-resolution features and/or the adjustment of feature edges (biasing) if the desired goal is to be obtained. Indeed, even when an experienced operator performs this task, it is often necessary to conduct a "trial and error" process in order to properly position the subresolution features to obtain the desired corrections. This trial and error process, which can entail repeated mask revisions followed by repeated simulations, can become both a time consuming and costly process.

In accordance with the foregoing description, there develops a systematic way in which designers optimize a mask pattern. FIG. 13 illustrates a flow chart of this systematic way. In S200, the device layout is examined, to identify a critical pitch (S202). Accordingly, adjustment is made to NA, sigma outer, and sigma inner parameters for a given lithographic apparatus (S204). Based on these parameters, an aerial image may be generated by a simulator for a given mask pattern to identify significant proximity effects for the given pattern. These effects may be addressed by scatter bar treatment to the mask, OPC treatment to adjust the pattern or a combination of both (S206). Still with scatter bar treatment and/or OPC treatment, an optimized bias and OPC treatment is still dependent on the parameters of the given lithographic apparatus such as NA, sigma-outer and sigma-inner. If changed, the routine has to be repeated for the mask. Often, this trial and error process is very time consuming to manually perfect for a given mask, and is primarily dependent on the skill of the designer manually adjusting parameters of the lithographic apparatus and performing the various treatments for addressing optical proximity effects.

Accordingly, there exists a need to create a method or routine that can optimize lithographic apparatus parameters and optimally configure biasing utilizing OPC.

SUMMARY

The disclosed concepts include a method and program product of optimizing lithographic apparatus settings and optimizing optical proximity correction (OPC) based on these settings for a pattern to be formed over a surface of a substrate. Steps include identifying a critical dense pitch and corresponding to a first critical feature and a second critical feature; determining optimal lithographic apparatus settings for the critical feature; performing OPC based on an analysis of the critical feature; performing OPC adjustments on the other critical feature; and optimizing lithographic apparatus settings for the other critical feature. Advantageously, OPC and lithographic apparatus settings may be mutually optimized.

The disclosed concepts further include an apparatus for optimizing lithographic apparatus settings and optimizing optical proximity correction (OPC) based on these settings for a pattern to be formed over a surface of a substrate. The apparatus includes a radiation system for supplying a projection beam, an illuminator for receiving the projection beam of radiation and projecting an adjusted beam of radiation a portion of a mask, wherein the illuminator has preset sigma-outer and preset sigma-inner parameters, and a projection system having a numerical aperture ("NA") for imaging a corresponding irradiated portion of a mask, onto a target portion of a substrate. NA, preset sigma-outer, and preset sigma-inner and OPC are mutually optimized for a plurality of features of the pattern including a critical feature.

The apparatus further includes a computer system configured to determine the preset NA, preset sigma-outer and preset sigma-inner parameters by identifying the critical feature and a non-critical feature of the plurality of features, determining optimal NA, preset sigma-outer, and preset sigma-inner settings such that the critical feature will print without bias adjustment, performing OPC based on an analysis of the critical feature, performing OPC adjustments on the non-critical feature, and optimizing NA, preset sigma-outer, and preset sigma-inner settings for the other feature.

The foregoing and other features, aspects, and advantages of the present disclosure will become more apparent from the following detailed description when taken in conjunction with the accompanying drawings.

DETAILED DESCRIPTION

Figure 1:
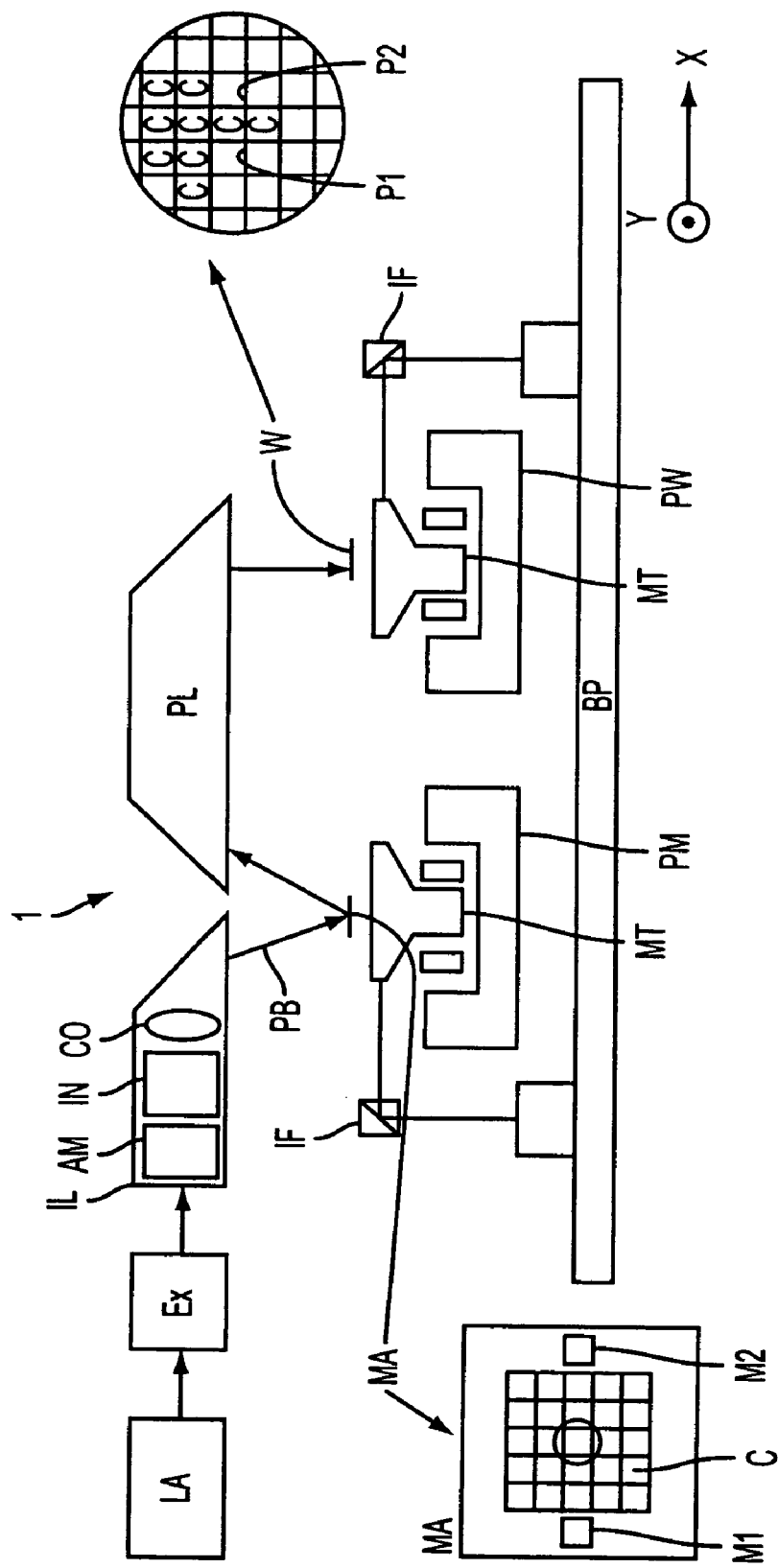
FIG. 1 illustrates an exemplary lithographic projection apparatus.

FIG. 1 schematically depicts a lithographic projection apparatus suitable for use following the concepts discussed herein. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W. The projection system has an adjustable numerical aperture ("NA").

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The embodiments discussed herein encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

Figure 2:
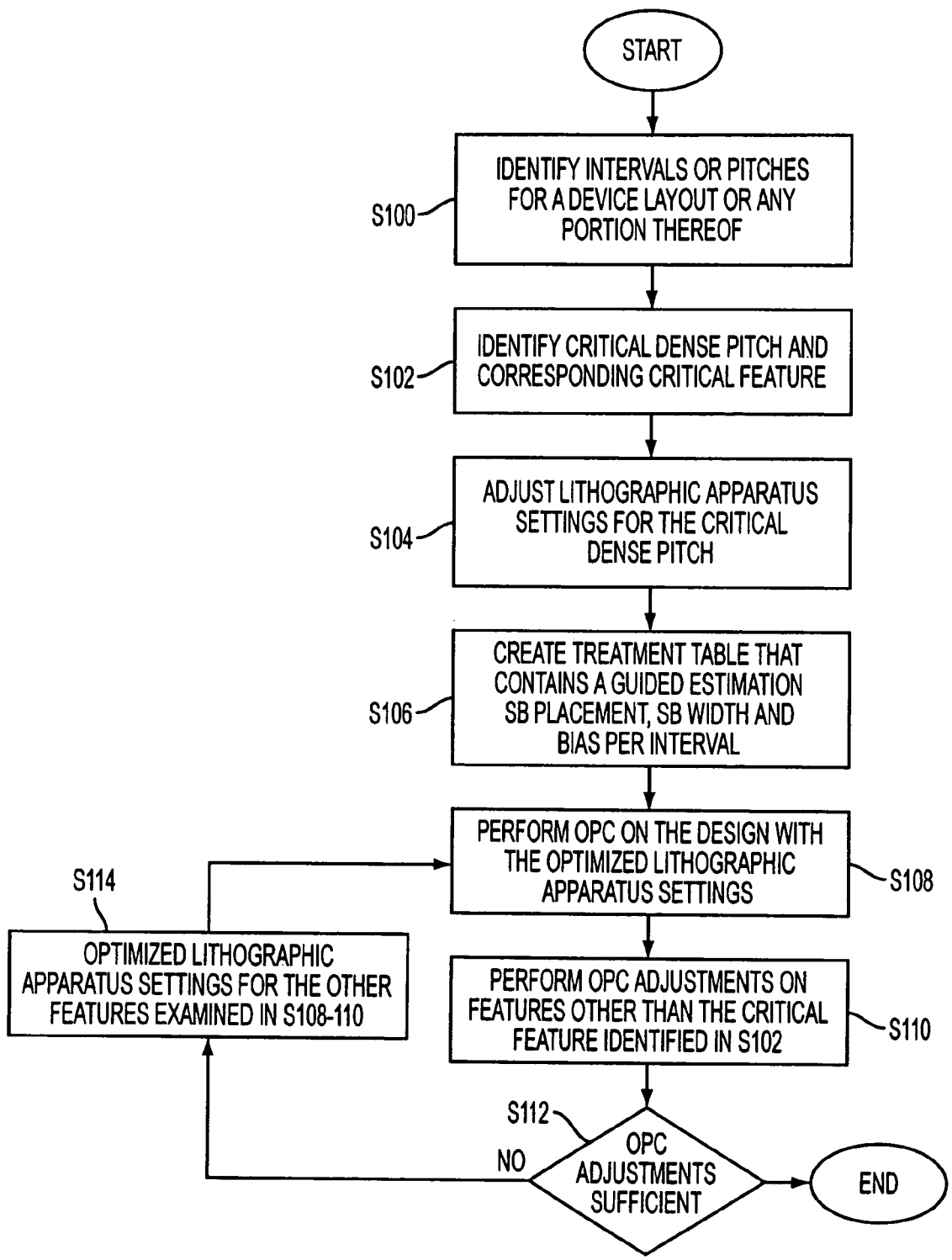
FIG. 2 illustrates an exemplary flow chart for optimizing exposure settings and SB treatment.

FIG. 2 is an exemplary flow diagram for optimizing lithographic apparatus settings, such as, NA and sigma-out and sigma-inner, and applying OPC treatment based on these optimized settings. In Step 100 (hereinafter Step is abbreviated by "S"), a pattern or portion thereof (hereinafter, "selected design") to be formed on a surface of a substrate is selected for analysis, and an interval or pitch analysis is performed on the selected design.

An interval may be defined as a distance from an edge of a feature to another edge of another feature. A pitch may be defined as an interval plus feature width. In other words, interval relates to the distance between two features, whereas a pitch corresponds to the distance between two features plus the width of each feature. As used herein, and as known by those of ordinary skill in the art, critical dense pitch corresponds to the smallest line width and interval in a design.

The interval or pitch analysis (S100) entails identifying the distribution of intervals or pitches for a selected design. Since pitch includes line width and interval, and because in a IC design the smallest line widths is specified by the design rule, results of an interval analysis can be easily converted to that which would result from a pitch analysis, and vice-versa. Therefore, for ease of explanation, the following will describe an interval analysis. But, in no way shall this disclosure be limited to an interval analysis.

Figure 3:
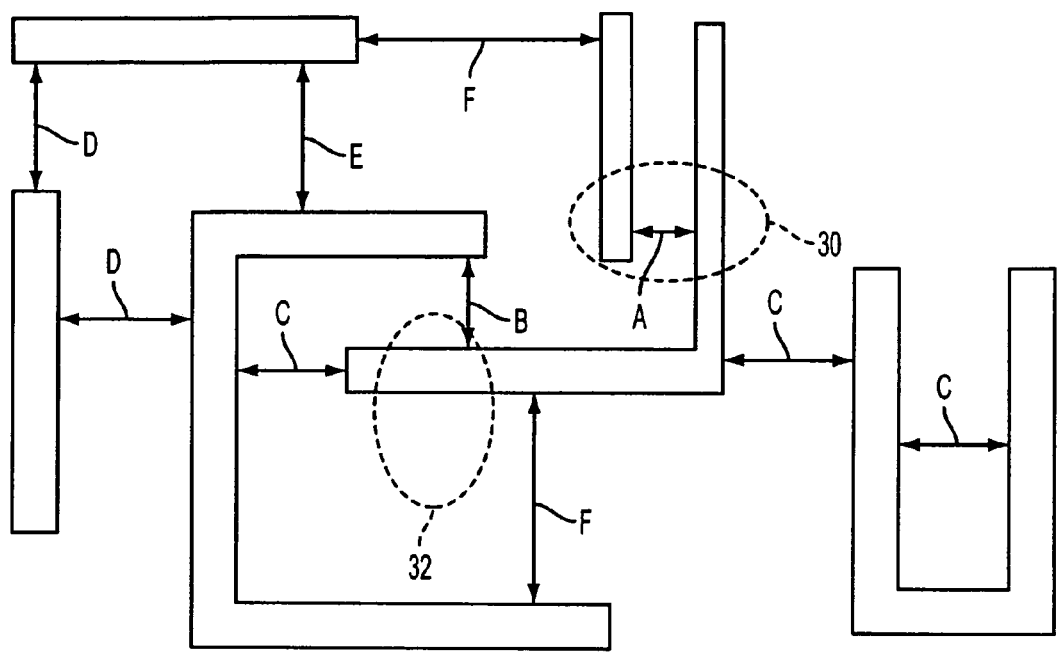
FIG. 3 illustrates an exemplary pattern or portion thereof to be formed over a surface of a substrate.

FIG. 3 illustrates an exemplary selected design. However, the intervals and pitches described herein are not limited to the selected design illustrated, and may include other designs incorporating contact holes or designs incorporating lines and contact hole(s). Intervals A, B, C, D, E, and F represent intervals having different numerical values. Any of numerous methods may be utilized for performing an interval analysis (S100) to identify the intervals A-F illustrated by FIG. 3. The method may include manually inspecting the selected design to identify each interval and to determine its value. Perhaps a simpler technique would entail using a mask simulation program. Such an exemplary software program is MASKWEAVER from ASML MaskTools that is capable of examining any selected design and identifying and grouping like intervals.

In S102, the critical dense pitch is identified. For discussion purposes, assume interval A corresponds to the critical dense pitch, i.e., the smallest combined interval and line width. It follows that feature 30 corresponds to the critical feature.

In S104, lithographic apparatus settings may be iteratively adjusted until critical feature 30 prints without the need for bias adjustment. The inventors have found that the NA and sigma (sigma-outer and sigma-inner) may be adjusted to cause a critical feature to print with or without bias adjustment. In other words, it is well known that any bias adjustment to a critical feature may worsen the optical proximity affects, and is often difficult to perform. Instead of adjusting the bias $B_A$ (i.e., altering feature geometry of feature 30) specified by an OPC analysis, lithographic apparatus settings (i.e., exposure dose, NA, sigma-outer, and sigma-inner) may be adjusted so that with or without bias adjustment feature 30 will print. Because the amount of bias adjustments to a critical feature are often limited, depending on the available space, adjusting lithographic apparatus settings is a simple way for causing the critical feature to print.

Methods for adjusting NA and sigma are known to those of ordinary skill in lithograph art. Perhaps the best way for adjusting these parameters may be accomplished by utilizing a simulation software package such as Lithocuriser from ASML MaskTools that automatically determines an optimal NA and sigma such that the critical feature will print. Of course, a skilled lithographer could manually and iteratively adjust these parameters until a suitable exposure dose is determined for printing the critical feature. In any event, optimal lithographic apparatus parameters, such as $NA_{optimal}$, sigma-outer$_{optimal}$ and sigma-inner$_{optimal}$, may be determined such that bias adjustment $B_A$ is not required for feature 30 to print.

If more than one critical pitch is identified, the "most" critical feature is identified and in most cases will corresponds to the smallest pitch, and optimal exposure dose parameters may be determined. The other critical pitch(s) may be overcome by adjusting bias B.

In S106, scatter bar (SB) placement, SB width and bias is determined for each interval in accordance with a guided estimation. This technique is well known to those of ordinary skill in the art, and generally entails a lithographer selecting SB width and placement for a given interval, and determining feature bias based on this interval. Simulation software, such as Lithocuriser from ASML MaskTools may provide such a guided estimation.

The results of the guided estimation of S106 may be tabulated, as is shown by exemplary Table 1. Accordingly, the size, placement, and length of each SB is shown in tabulated form together with any bias adjustment.

TABLE 1

| Interval | SB Placement | SB Width | SB Length | Bias |
|---|---|---|---|---|
| A | $(x, y)_A$ | $W_A$ | $L_A$ | $B_A$ |
| B | $(x, y)_B$ | $W_B$ | $L_B$ | $B_B$ |
| C | $(x, y)_C$ | $W_C$ | $L_C$ | $B_C$ |
| D | $(x, y)_D$ | $W_D$ | $L_D$ | $B_D$ |
| E | $(x, y)_E$ | $W_E$ | $L_E$ | $B_E$ |
| F | $(x, y)_F$ | $W_F$ | $L_F$ | $B_F$ |

In S108, an OPC analysis is performed on the selected design shown in FIG. 3 that generates rules for intervals A-F, based on the guided estimation provided in S106. Techniques for generating SB rules through an OPC analysis are known to those of ordinary skill in the lithography art, and will require input of known lithographic apparatus parameters. These may include the numerical aperture ("NA") of the lens of a lithographic apparatus and sigma-outer and sigma-inner, which were discussed in connection to FIG. 1. Based on an analysis of optical proximity affects, OPC rules may be generated for each interval which specifies SB placement (x,y), SB Width (W), SB length (L), how many SB and any bias adjustment (B) for each interval. Results of the OPC analysis may be tabulated, as shown by Table 2. There is no bias adjustment required on the critical feature 30, which corresponds to interval A.

TABLE 2

| Interval | SB Placement | SB Width | SB Length | SB Amount | Bias |
|---|---|---|---|---|---|
| A | $(x, y)_A$ | $W_A$ | $L_A$ | SB# | 0 |
| B | $(x, y)_B$ | $W_B$ | $L_B$ | SB# | $B_B$ |
| C | $(x, y)_C$ | $W_C$ | $L_C$ | SB# | $B_C$ |
| D | $(x, y)_D$ | $W_D$ | $L_D$ | SB# | 0 |
| E | $(x, y)_E$ | $W_E$ | $L_E$ | SB# | $B_E$ |
| F | $(x, y)_F$ | $W_F$ | $L_F$ | SB# | 0 |

Figure 4:
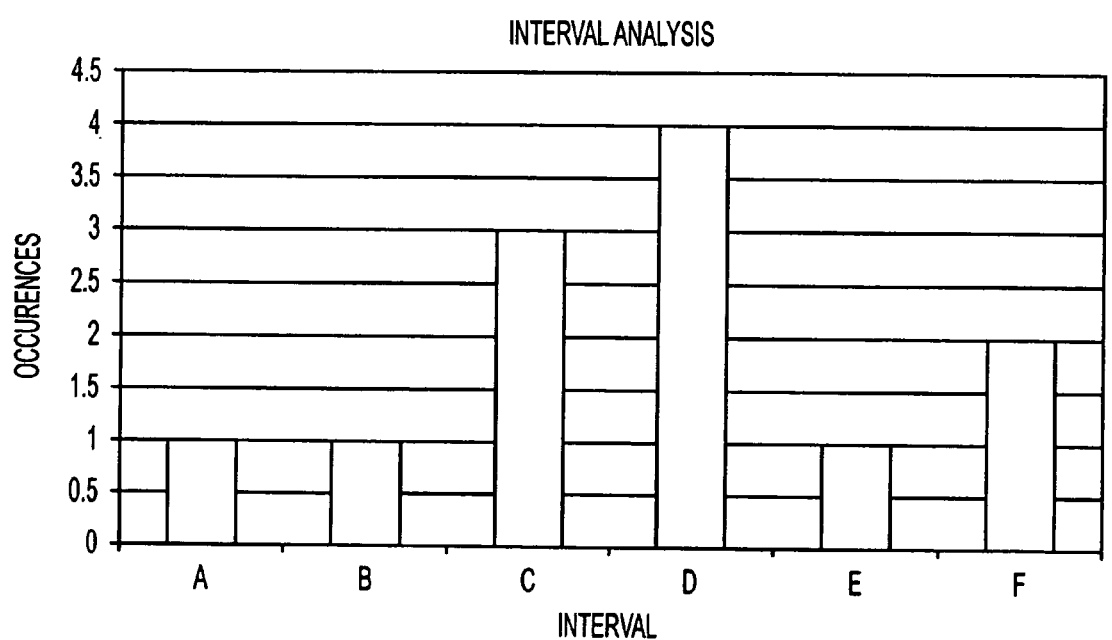
FIG. 4 illustrates an exemplary chart of a pitch analysis conducted for the pattern illustrated by FIG. 3.

FIG. 4 illustrates an exemplary histogram that may be generated for the selected design of FIG. 3. The x-axis indicates intervals A-F and the y-axis indicates the frequency of each interval A-F. Advantageously, this chart identifies the interval amounts in the design for optimizing the SB placement (x,y), SB Width (W), SB length (L), how many SB and any bias adjustment (B) for each interval. Without this analysis, a skilled lithographer may miss some intervals that is critical for the design to get properly printed on wafer.

In S110, OPC adjustments are performed on the features other than the critical feature 30. Techniques for performing OPC adjustments are known to those of ordinary skill in the art. A brief description will be given.

The inventors have found that the actual process window is substantially smaller, when taking into consideration other features (including the critical feature) in the design. Thus, the inventors have found that further enhancement of the lithographic apparatus settings, and OPC treatment, will increase the process window for multiple features.

In S110, OPC adjustments are performed on features other than the critical feature, and such a feature 32 is illustrated by FIG. 3. These adjustments may be made by a cost function analysis of feature 32.

Equation 1 is a cost function that factors in the difference or deviation between a predicted critical dimension (CD) and targeted CD for determining an optimal bias value.

Other cost functions may be utilized for determining an optimal bias value. However, Equation 1 is useful for gradient based methods.

$$\text{Equation 1} \rightarrow C_1(b_1, b_2 \ldots b_n) = \sum_i^M |\Delta E_i|^N$$

where, $b_0, b_1, \ldots, b_n$ correspond to bias values
$\Delta E_i$ corresponds to the deviation between a targeted CD and a predicted CD,
$(0 \leq i \leq M)$ corresponds to the any number of samples, and
N is a metric applied for solving for the an average case and worst case behavior of a chip.

Equation 1 may solved for a worst case behavior (N is set at a high value). Typically, designers choose N=4, however, other values may be used. By solving for a worst case behavior, chip failure (e.g., caused by bridging) may be increasingly avoided. According to Equation 1, an increasingly higher result ($C_1$) corresponds to increasingly worst case behavior of a chip design. Therefore, equation 1 should be solved for a bias value ($b_0, b_1, \ldots b_n$) in which $C_1$ is a minimum.

Next, SBs are optimized. Equation 2 represents a cost function for determining optimal scattering bar placements.

$$\text{Equation 2} \rightarrow C_2(d_0^1, d_1^1, \ldots d_n^1; d_0^2, d_1^2, \ldots {}_n^2) = \sum_i^M \frac{1}{|NILs|^N}$$

where, $d_0^1, d_1^1, \ldots d_n^1$ corresponds to $SB_1$ distance in a certain interval (defined from an edge of a feature),
$d_0^2, d_1^2, \ldots {}_n^2$ corresponds to $SB_2$ distance in the interval (define from the edge of the feature),
$(0 \leq i \leq M)$ corresponds to the any number of samples, and
N is a metric applied for solving for the an average case and worst case behavior of a chip.

Like Equation 1, Equation 2 may solved for a worst case behavior (N is set at a high value). Typically, designers choose N=4, however, other values may be used. By solving for a worst case behavior, chip failure may be increasingly avoided. According to Equation 2, an increasingly higher result ($C_2$) corresponds to increasingly worse case behavior of a chip design. Therefore, equation 2 should be solved for distance values $d_0^1, d_1^1, \ldots d_n^1$ and $d_0^2, d_1^2, \ldots {}_n^2$ in which $C_1$ is a minimum.

Results of OPC adjustments of S110 are shown by Table 3. Assume that "[value]'" represents an optimized value in accordance with S110.

TABLE 3

| Interval | SB Placement | SB Width | SB Length | SB Amount | Bias |
|---|---|---|---|---|---|
| A | (x, y)$_A$ | $W_A$ | $L_A$ | SB# | 0 |
| B | (x, y)$_B$ | $W_B$ | $L_B$ | SB# | $B_B$ |
| C | (x, y)$_C$' | $W_C$' | $L_C$' | SB# | $B_C$' |
| D | (x, y)$_D$ | $W_D$ | $L_D$ | SB# | 0 |
| E | (x, y)$_E$' | $W_E$' | $L_E$' | SB# | $B_E$' |
| F | (x, y)$_F$ | $W_F$ | $L_F$ | SB# | 0 |

In S112, it is determined whether OPC adjustments are sufficient. One of ordinary skill in the art can make this judgment. The sufficiency of the OPC adjustments in S110 may be considered by examining any increase in the process window with the newly optimized settings. Also, a lithographer may set a target process window for the entire design. For example, a designer may set a target process window for multiple features to be at least 75% area of the process window taking into consideration only the critical feature 30 or specify a specific depth of focus (DOF) at certain value of exposure latitude (EL).

If it is determined that OPC treatment is not sufficient, lithographic apparatus settings are further optimized based on the mask design which has been OPC-adjusted in step S110. newly selected feature. S108 and S110 will be repeated until sufficient OPC treatment has been accomplished. As opposed to optimizing lithographic apparatus settings for just the critical feature, lithographic apparatus settings may be optimized for multiple features (i.e., the entire mask design).

EXAMPLE

Figure 5:
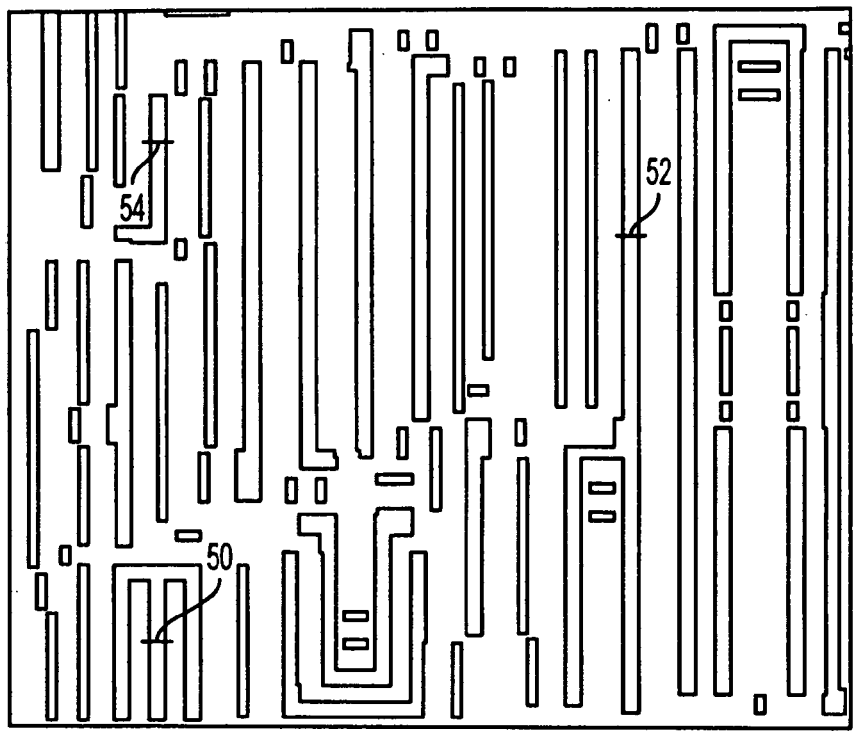
FIG. 5 illustrates an exemplary target pattern which was optimized in accordance with the unique concepts disclosed herein.

FIG. 5 illustrates an exemplary target pattern. Reference numeral 50 denotes a critical feature (corresponding to the critical pitch of 320 nm), and reference numerals 52 and 54 denote other semi-isolated features other than the critical features. Critical features 50 were identified corresponding to S100 and S102 (FIG. 2). The exemplary pattern of FIG. 5 was illuminated using Quasar illumination having the parameters listed in Table 4.

TABLE 4

| Quasar Illumination | |
|---|---|
| Parameter | Setting |
| Wavelength | 0.248 |
| NA | 0.7 |
| Sigma Outer | 0.85 |
| Sigma Inner | 0.55 |

In S106 (FIG. 2), lithographic apparatus settings may be optimized for the critical feature 50. Table 5 list the optimized parameters in accordance with S106, and corresponding process window area.

TABLE 5

| Optimized Quasar Illumination for CF 50 | |
|---|---|
| Parameter | Setting |
| Wavelength | 0.248 |
| NA | 0.77 |
| Sigma Outer | 0.76 |
| Sigma Inner | 0.52 |
| Process Window Area | 1194.589573 |

Figure 6:
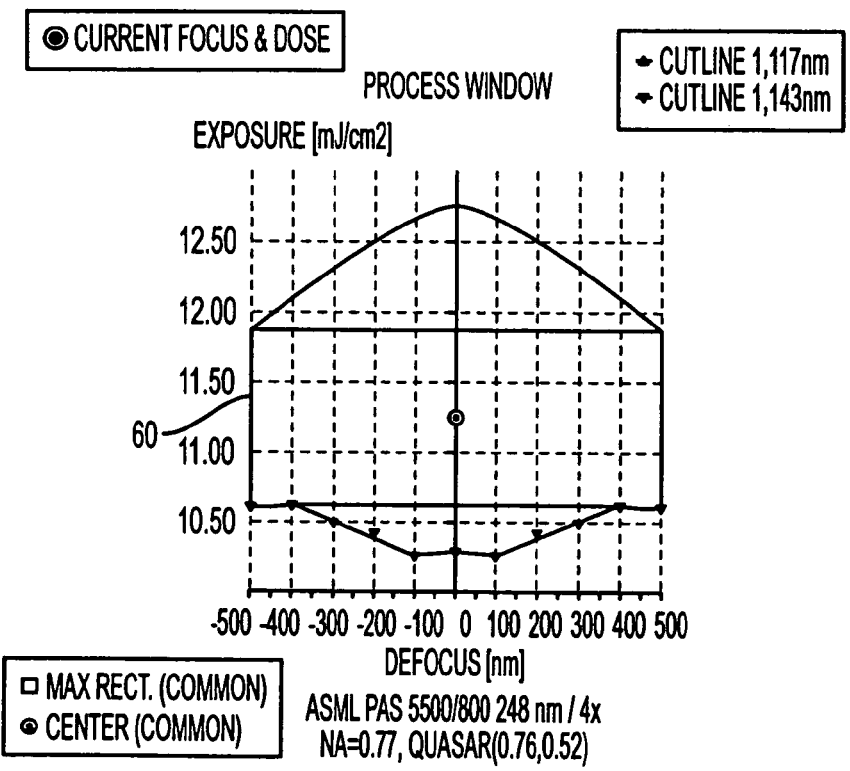
FIG. 6 illustrates a process window for the target pattern having exposure settings optimized for the critical pitch.
Figure 7:
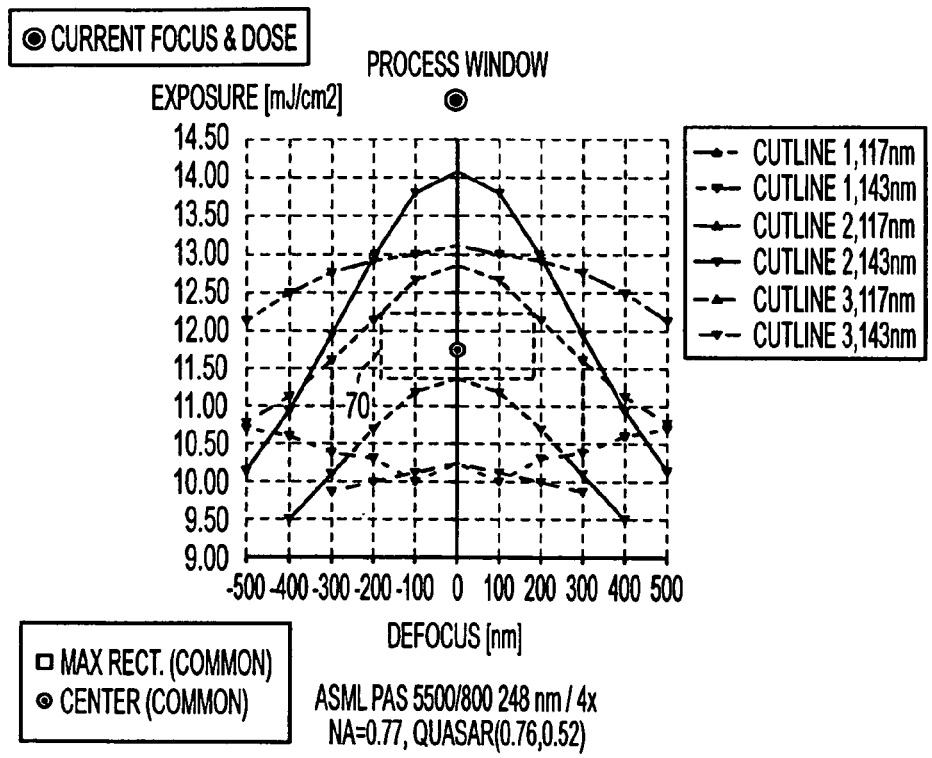
FIG. 7 illustrates the process window for the plurality of cut lines illustrated by FIG. 5.

FIG. 7 illustrates the process window 70 for multiple cut lines 50, 52, 54, which are illustrated by FIG. 5. When cut lines, in addition to cut line 50 are considered, the process window 70 decreases in size as compared to the process window 60 of FIG. 6. In fact, the area of process window 60 is dramatically reduced to 323.64918 (nm×mj/cm2).

Figure 8:
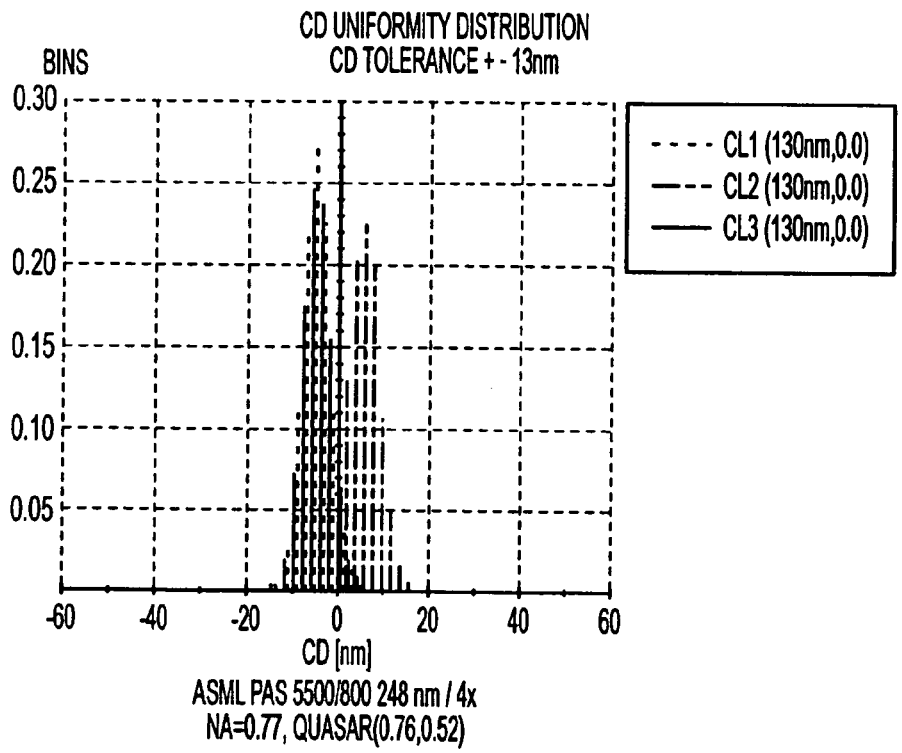
FIG. 8 illustrates a CD uniformity distribution.
Figure 9:
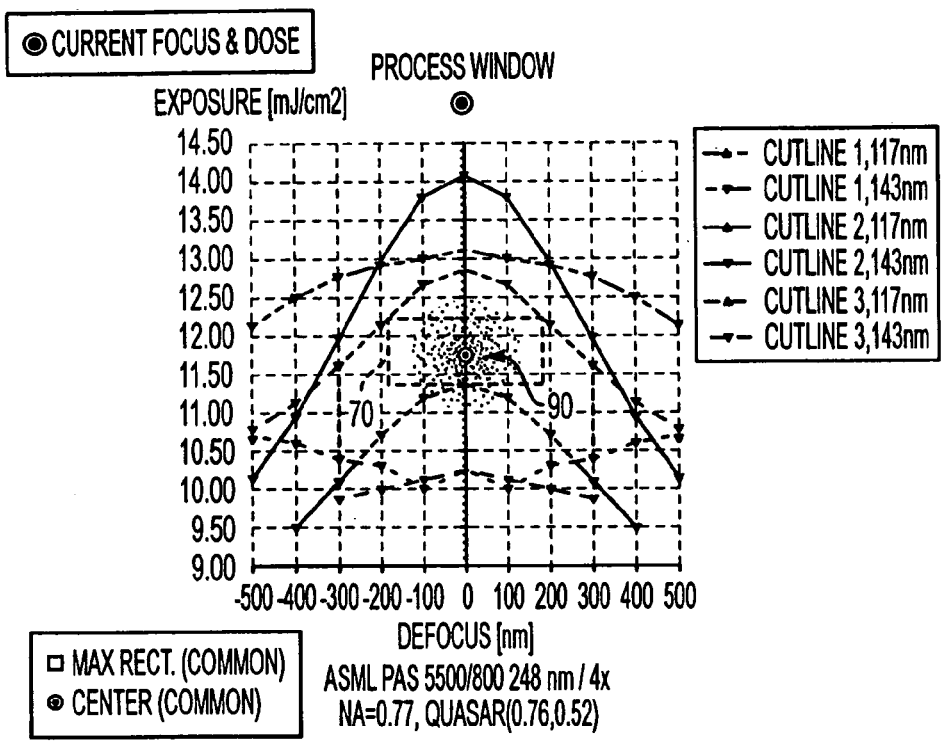
FIG. 9 illustrates the process window for the plurality of cut lines illustrated by FIG. 5 and CD values.

FIGS. 8 and 9 are illustrative of the robustness of a lithographic apparatus that may have variations in exposure settings and focus. Ideally, any variations should cause corresponding variations within the critical dimension control specification. However, as seen in FIG. 8, CD becomes bimodal in accordance with a variation of exposure settings and focus and there are CD value fall outside of the specification. This is caused by operation outside of the process window 70, also shown by FIG. 9. Further plotted on the graph of FIG. 9 is a plurality of CD values in accordance with a variation of exposure settings and focus. Ideally, the CD values should remain within process window 70. It is readily apparent that this is not the case. This is one of the problems that the disclosed concepts overcome by mutually optimizing exposure settings and OPC adjustments for a plurality of features including the critical feature 50. FIGS. 8 and 9 are illustrative of insufficient OPC adjustments determined in S112.

Recall that in S110, OPC adjustments are made on features other than the critical feature 50. In this example, OPC adjustments would be made based on other features 52, 54. Accordingly, the analysis of feedback loop comprising S108-S114 would cycle twice. Of course, S110 may perform OPC adjustments on other features 52, 54.

Figure 10:
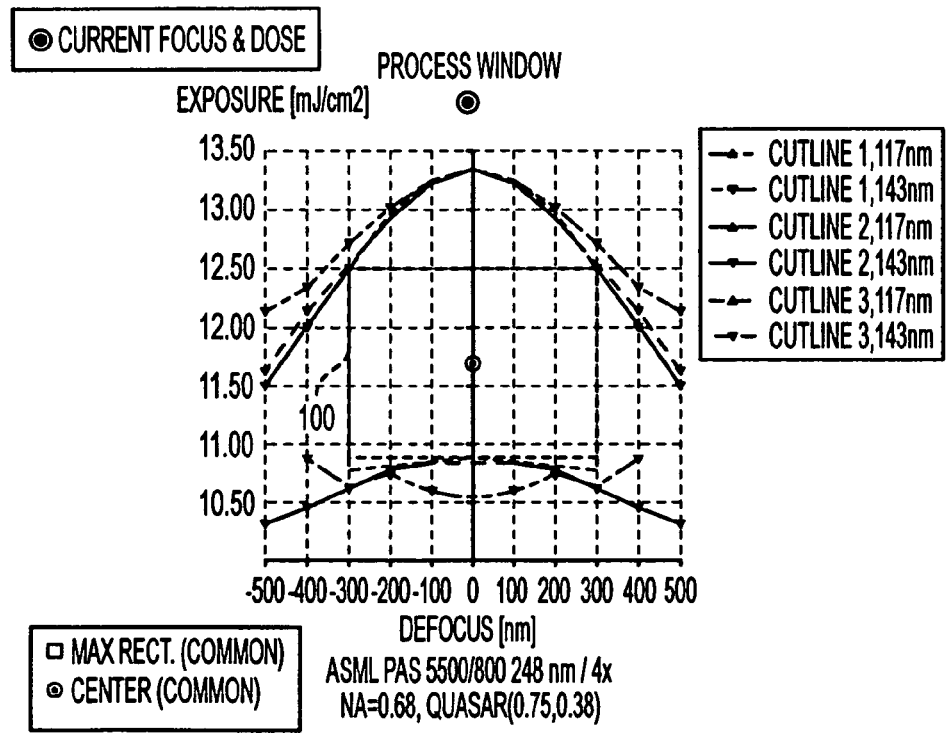
FIG. 10 illustrates the process window for the plurality of cut lines in accordance with newly optimized exposure settings and OPC for a plurality of features.

FIG. 10 is a prime illustration of the process window for exposure settings and OPC mutually optimized for a plurality of features 50, 52, 54 including the critical feature 50. Table 6 lists the corresponding optimized exposure settings. By mutually optimizing exposure settings and OPC adjustments in accordance with a plurality of features, the process window area has been increased by almost 300% as compared to the process window (FIG. 7).

TABLE 6

Optimized Quasar Illumination for features 50-54

| Parameter | Setting |
|---|---|
| Wavelength | 0.248 |
| NA | 0.68 |
| Sigma Outer | 0.75 |
| Sigma Inner | 0.38 |
| Process Window Area | 941.654454 |

Figure 11:
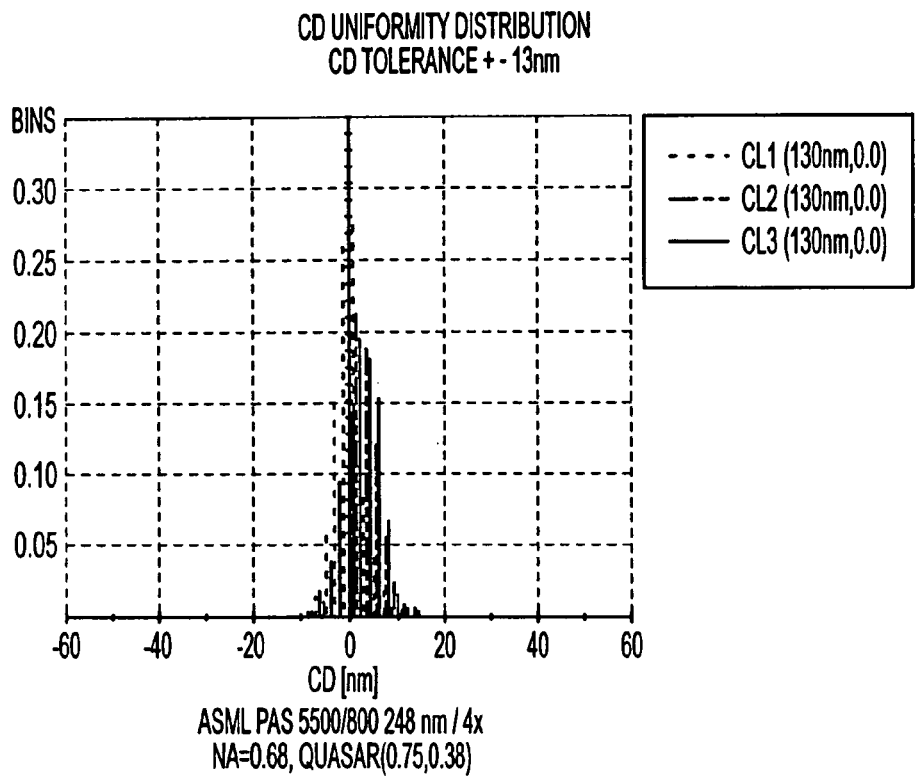
FIG. 11 illustrates the CD uniformity distribution for the plurality of cut lines in accordance with newly optimized exposure settings.
Figure 12:
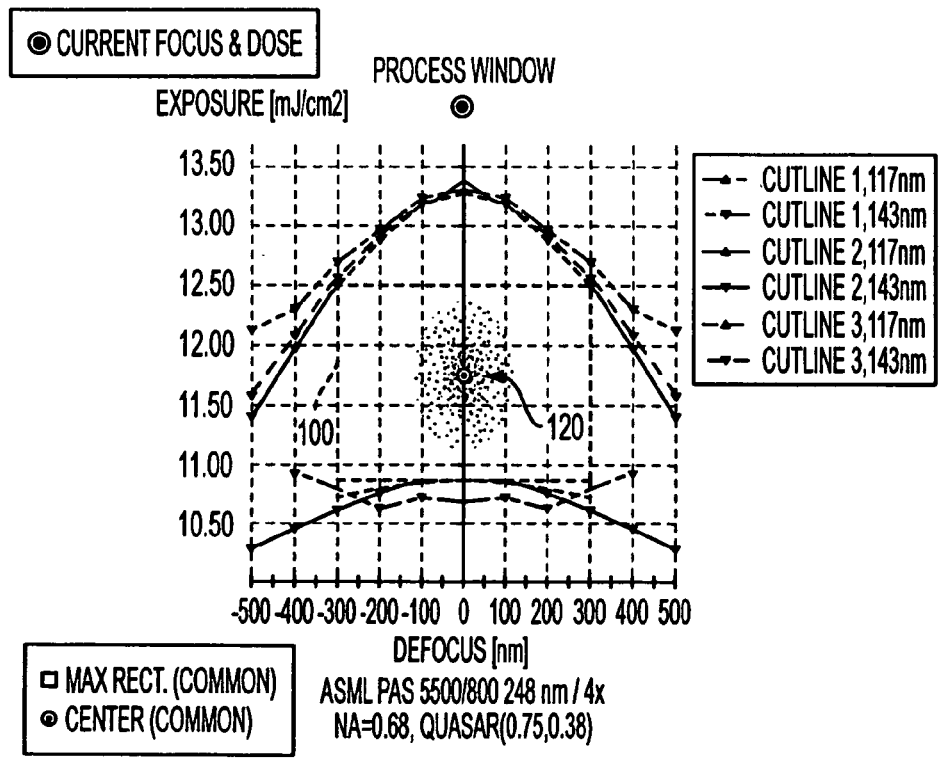
FIG. 12 illustrates the process window for the plurality of cut lines in accordance with newly optimized exposure settings and OPC for a plurality of features and CD values.
Figure 13:
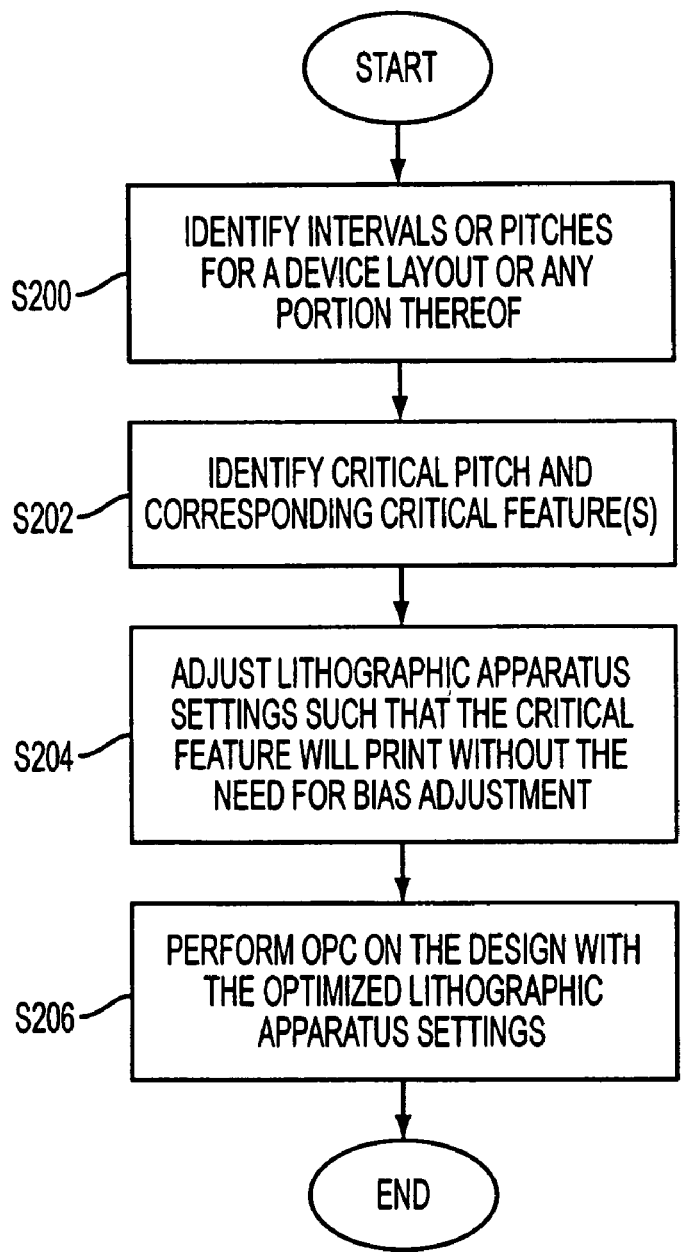
FIG. 13 illustrates a flow chart for optimizing exposure settings and SB treatment in accordance with the prior art.

FIGS. 11 and 12 are illustrative of the optimized robustness of a lithographic apparatus that may have variations in exposure settings and focus variations. Again, any variations should cause corresponding variations in the critical dimension. As seen in FIG. 11, CD somewhat symmetrically changes with variations of exposure settings and focus, because operation is within process window 100, also shown by FIG. 12. Further plotted on the graph of FIG. 12 is a plurality of CD values in accordance with a variation of exposure settings and focus. By mutually optimizing exposure settings and OPC for a plurality of features including the critical feature 50, variations of CD fall within the process window that, in turn, increases process margin.

Software may implement or aid in performing the disclosed concepts. Software functionalities of a computer system involve programming, including executable code, may be used to implement the above described optimization techniques. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of optimizing lithographic apparatus settings and optimizing optical proximity correction (OPC) for a pattern to be formed on a surface of a substrate, said method comprising the steps of:
   (a) identifying a critical dense pitch corresponding to a first critical feature and a second critical feature;
   (b) determining optimal lithographic apparatus settings for the first critical feature;
   (c) performing OPC based on an analysis of the first critical feature;
   (d) performing OPC adjustments on the second critical feature; and
   (e) optimizing lithographic apparatus settings for the second critical feature.

2. The method according to claim 1, wherein lithographic settings comprise numerical aperture of a lens and sigma of an illuminator.

3. The method according to claim 1, further comprising the step of repeating steps (d) and (e) for a plurality of critical features until OPC adjustments satisfy a predetermined criteria.

4. The method according to claim 1, further comprising the steps of:
   (f) identifying a plurality of intervals or a plurality of pitches of a design;
   (g) categorizing like intervals of the plurality of intervals or like pitches of the plurality of pitches; and
   (h) determining an interval or a pitch with the most occurrences.

5. A computer program product on a machine readable medium comprising executable code transportable by at least one machine readable medium, wherein execution of the code by at least one programmable computer causes the at least one programmable computer to perform a sequence of steps for optimizing lithographic apparatus settings and optimizing optical proximity correction (OPC) for a pattern to be formed on a surface of a substrate, comprising the steps of:

(a) identifying a critical dense pitch corresponding to a first critical feature and a second critical feature;

(b) determining optimal lithographic apparatus settings for the first critical feature;

(c) performing OPC based on an analysis of the first critical feature;

(d) performing OPC adjustments on the second critical feature; and (e) optimizing lithographic apparatus settings for the second critical feature.

6. The computer program product according to claim 5, wherein lithographic settings comprise numerical aperture of a lens and sigma in and sigma_out setting of an illuminator.

7. The computer program product according to claim 5, further comprising the step of repeating steps (d) and (e) for a plurality of critical features until OPC adjustments are sufficient.

8. The computer program product according to claim 5, further comprising the steps of:

(f) identifying a plurality of intervals or a plurality of pitches of a design;

(g) categorizing like intervals of the plurality of intervals or like pitches of the plurality of pitches; and (h) determining an interval or a pitch with the most occurrences.

9. An apparatus optimizing lithographic apparatus settings and optimizing optical proximity correction (OPC) for a pattern to be formed on a surface of a substrate, said apparatus comprising:

a radiation system for supplying a projection beam;

an illuminator for receiving the projection beam of radiation and projecting an adjusted beam of radiation on a portion of a mask, wherein the illuminator has preset sigma-outer and preset sigma-inner parameters, and a projection system having a numerical aperture ("NA") for imaging a corresponding irradiated portion of a mask, onto a target portion of the substrate, wherein NA, preset sigma-outer, and preset sigma-inner and OPC are mutually optimized for a plurality of critical features of the pattern.

10. The apparatus according to claim 9, further comprising:

a computer system configured to determine the preset NA, preset sigma-outer and preset sigma-inner parameters by the steps comprising:

(a) identifying a critical dense pitch corresponding to a first critical feature and a second critical feature;

(b) determining optimal lithographic apparatus settings for the first critical feature;

(c) performing OPC based on an analysis of the first critical feature;

(d) performing OPC adjustments on the second critical feature; and (e) optimizing lithographic apparatus settings for the second critical feature.

11. The apparatus according to claim 10, further comprising the step of repeating steps (d) and (e) for a plurality of non-critical features until OPC adjustments are sufficient.

* * * * *